(12) United States Patent
Kim et al.

(10) Patent No.: US 9,621,985 B2
(45) Date of Patent: Apr. 11, 2017

(54) APPARATUS AND METHOD FOR ADJUSTING VOLUME IN TERMINAL

(71) Applicant: Samsung Electronics Co., Ltd, Gyeonggi-do (KR)

(72) Inventors: Jae-Hyun Kim, Gyeonggi-do (KR); Kyoung-Ho Bang, Seoul (KR); Sang-Hoon Oh, Gyeonggi-do (KR); Jun-Soo Lee, Gyeonggi-do (KR)

(73) Assignee: SAMSUNG ELECTRONICS CO., LTD, Suwon-si, Gyeonggi-Do (KR)

( * ) Notice: Subject to any disclaimer, the term of this patent is extended or adjusted under 35 U.S.C. 154(b) by 573 days.

(21) Appl. No.: 13/913,204

(22) Filed: Jun. 7, 2013

(65) Prior Publication Data
US 2013/0329911 A1    Dec. 12, 2013

(30) Foreign Application Priority Data
Jun. 8, 2012    (KR) .................. 10-2012-0061382

(51) Int. Cl.
*H04R 3/00* (2006.01)
*H03G 3/04* (2006.01)
*H03G 3/30* (2006.01)

(52) U.S. Cl.
CPC .............. *H04R 3/00* (2013.01); *H03G 3/04* (2013.01); *H03G 3/3026* (2013.01)

(58) Field of Classification Search
CPC combination set(s) only.
See application file for complete search history.

(56) References Cited

U.S. PATENT DOCUMENTS

| | | | |
|---|---|---|---|
| 4,868,687 A * | 9/1989 | Penn | G06F 17/21 360/13 |
| 7,496,418 B2 * | 2/2009 | Kim | G11B 27/034 381/107 |
| 2004/0218514 A1 | 11/2004 | Ieda et al. | |
| 2005/0049735 A1 * | 3/2005 | Kim | G11B 27/034 700/94 |
| 2006/0018493 A1 | 1/2006 | Oh et al. | |
| 2006/0153405 A1 | 7/2006 | Myers | |

(Continued)

FOREIGN PATENT DOCUMENTS

| | | |
|---|---|---|
| KR | 10 2002-0016169 A | 3/2002 |
| KR | 10 2006-0073318 A | 6/2006 |

(Continued)

OTHER PUBLICATIONS

International Search Report dated Sep. 26, 2013 in connection with International Patent Application No. PCT/KR2013/004906, 5 pages.

(Continued)

*Primary Examiner* — Duc Nguyen
*Assistant Examiner* — Assad Mohammed

(57) ABSTRACT

A method terminal includes an apparatus for automatically adjusting volume in the terminal. An automatic volume adjuster extracts a representative volume from individual frame information of an audio file, and adjusts a master volume by a deviation between the extracted representative volume and a reference volume, and a controller plays the audio file with the master volume adjusted by the automatic volume adjuster.

19 Claims, 6 Drawing Sheets

(56) References Cited

U.S. PATENT DOCUMENTS

| | | | | |
|---|---|---|---|---|
| 2007/0064954 A1* | 3/2007 | Booth | ...................... | H04R 5/04 |
| | | | | 381/58 |
| 2008/0013745 A1 | 1/2008 | Chen | | |
| 2008/0051970 A1* | 2/2008 | Oh | ........................... | G06F 3/14 |
| | | | | 701/93 |
| 2008/0253587 A1* | 10/2008 | Une | ...................... | H03G 3/001 |
| | | | | 381/107 |
| 2009/0245537 A1* | 10/2009 | Morin | .......................... | 381/107 |
| 2010/0085117 A1 | 4/2010 | Moon et al. | | |
| 2012/0281965 A1* | 11/2012 | Hunt | ...................... | H04N 5/76 |
| | | | | 386/241 |

FOREIGN PATENT DOCUMENTS

| | | |
|---|---|---|
| KR | 10-0630206 | 9/2006 |
| KR | 10 0630206 B1 | 9/2006 |
| KR | 10-2007-0100989 | 10/2007 |

OTHER PUBLICATIONS

Written Opinion of International Searching Authority dated Sep. 26, 2013 in connection with International Patent Application No. PCT/KR2013/004906, 6 pages.

First Office Action dated May 5, 2016 in connection with Chinese Patent Application No. 201380030273.4, 11 pages.

\* cited by examiner

APPARATUS AND METHOD FOR ADJUSTING VOLUME IN TERMINAL

CROSS-REFERENCE TO RELATED APPLICATION(S) AND CLAIM OF PRIORITY

The present application is related to and claims the benefit under 35 U.S.C. §119(a) of a Korean Patent Application filed in the Korean Intellectual Property Office on Jun. 8, 2012 and assigned Serial No. 10-2012-0061382, the entire disclosure of which is incorporated herein by reference.

TECHNICAL FIELD

The present application relates generally to an apparatus and method for adjusting volume in a terminal, and more particularly, to a volume adjustment apparatus and method capable of automatically adjusting volume in a terminal.

BACKGROUND

In many cases, even the same audio file may have different volume, since every audio file may be affected by an encoder and/or different external environments.

Audio files in different genres also can have different volumes. For example, if an audio file with a greater volume, such as heavy metal audio files, is played in succession while a user is listening to a silent audio file, such as classic and ballad audio files, the sound deviation the user feels may be significant, causing great inconvenience to the user.

SUMMARY

To address the above-discussed deficiencies of the prior art, it is a primary object is to provide a volume adjustment apparatus and method capable of automatically adjusting volume in a terminal.

Another aspect of an exemplary embodiment of the present disclosure is to provide a volume adjustment apparatus and method for quickly extracting a representative volume of a song without performing full decoding on each audio file to extract a deviation in volume between audio files, in a terminal.

Further another aspect of an exemplary embodiment of the present disclosure is to provide a volume adjustment apparatus and method for reducing a latency time of a process of extracting a volume deviation between audio files, and automatically performing the volume deviation extraction, in a terminal.

In accordance with one aspect of the present disclosure, there is provided an apparatus for adjusting volume in a terminal. The apparatus includes an automatic volume adjuster for extracting a representative volume from individual frame information of an audio file, and adjusting a master volume by a deviation between the extracted representative volume and a reference volume; and a controller for playing the audio file with the master volume adjusted by the automatic volume adjuster.

In accordance with another aspect of the present disclosure, there is provided a method for adjusting volume in a terminal. The method includes extracting a representative volume from individual frame information of an audio file; and adjusting a master volume by a deviation between the extracted representative volume and a reference volume, and playing the audio file with the adjusted master volume.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, the same drawing reference numerals will be understood to refer to the same elements, features and structures.

DETAILED DESCRIPTION OF THE INVENTION

FIGS. 1 through 6B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication device. Preferred embodiments of the present application will now be described in detail with reference to the accompanying drawings. In the following description, specific details such as detailed configuration and components are merely provided to assist the overall understanding of exemplary embodiments of the present application. Therefore, it should be apparent to those skilled in the art that various changes and modifications of the embodiments described herein can be made without departing from the scope and spirit of the application. In addition, descriptions of well-known functions and constructions are omitted for clarity and conciseness.

Terminals, to which exemplary embodiments of the present disclosure are applicable, include mobile terminals and fixed terminals. The mobile terminals, which are easy-to-carry mobile electronic devices, include video phones, mobile phones, smart phones, International Mobile Telecommunication-2000 (IMT-2000) terminals, Wideband Code Division Multiple Access (WCDMA) terminals, Universal Mobile Telecommunication Service (UMTS) terminals, Personal Digital Assistants (PDAs), Portable Multimedia Players (PMPs), Digital Multimedia Broadcasting (DMB) terminals, E-Book terminals, portable computers (e.g., laptop computers and tablet computers), and digital cameras. The fixed terminals include desktop Personal Computers (PCs).

Figure 1:
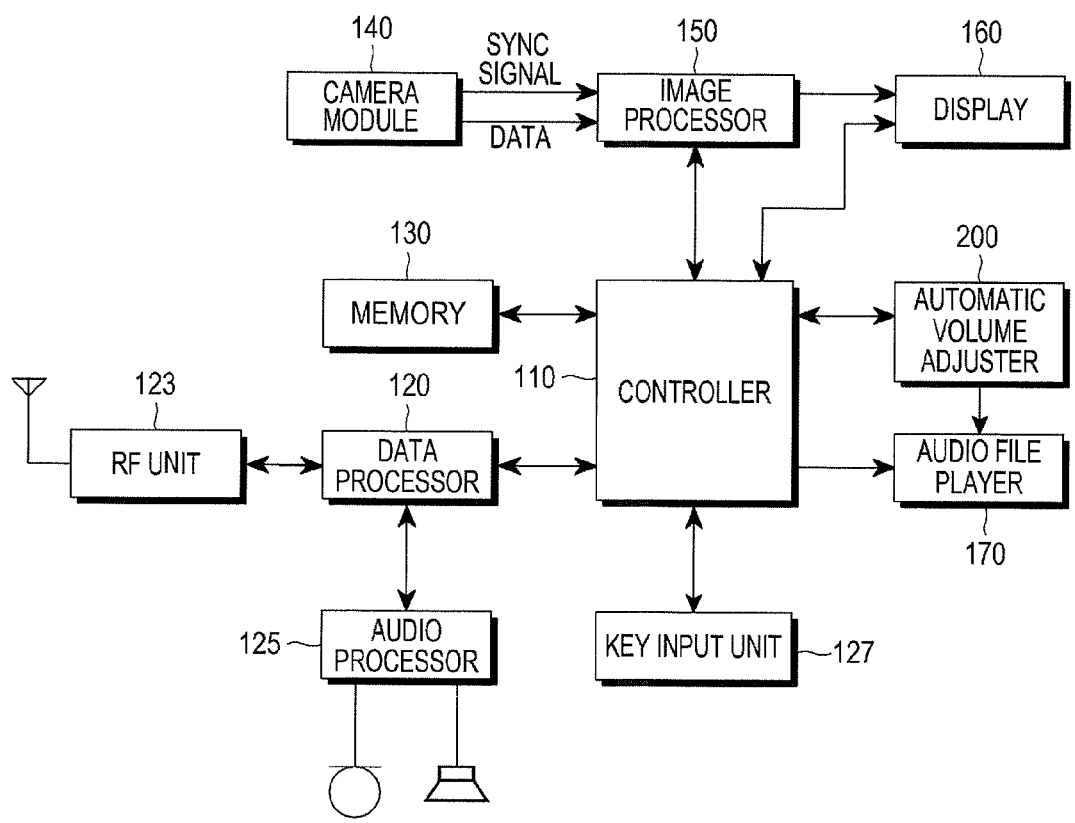
FIG. 1 illustrates a structure of a terminal according to an embodiment of the present disclosure.

FIG. 1 illustrates a structure of a terminal according to an embodiment of the present disclosure.

Referring to FIG. 1, a Radio Frequency (RF) unit 123 is responsible for wireless communication of the terminal. The RF unit 123 includes an RF transmitter for up-converting a frequency of transmission signals and amplifying the up-converted transmission signals, and an RF receiver for low-noise-amplifying received signals and down-converting a frequency of the amplified received signals. A data processor 120 includes a transmitter for coding and modulating the transmission signals, and a receiver for demodulating and decoding the received signals. In other words, the data processor 120 consists of a modulator/demodulator (modem) and a coder/decoder (codec). The codec includes a data codec for processing packet data and the like, and an audio codec for processing audio signals such as voice. An audio processor 125 plays received audio signals output from the audio codec in the data processor 120 using a speaker, and transfers transmission audio signals picked up by a microphone to the audio codec in the data processor 120.

A key input unit 127 includes numeric/character keys for inputting numeric/character information, and function keys for setting various functions.

A camera module 140 includes a camera sensor for capturing image data and converting the captured optical image signals into electrical image signals, and a signal processor for converting analog image signals captured by the camera sensor into digital image data. The camera sensor can be a Charge-Coupled Device (CCD) or Complementary Metal-Oxide Semiconductor (CMOS) sensor, and the signal processor can be implemented with a Digital Signal Processor (DSP). The camera sensor and the signal processor can be implemented integrally or separately.

An image processor 150 performs Image Signal Processing (ISP) to display the image signals output from the camera module 140 on a display 160. The ISP includes gamma correction, interpolation, spatial variation, image effecting, image scaling, Auto White Balance (AWB), Auto Exposure (AE), Auto Focus (AF), etc. The image processor 150 processes the image signals output from the camera module 140 on a frame-by-frame basis, and outputs the frame image data depending on the characteristic and size of the display 160. The image processor 150, which includes a video codec, compresses the frame image data displayed on the display 160 using a preset coding scheme, and restore (or decompress) the compressed frame image data into its original frame image data using a decoding scheme corresponding to the coding scheme. The video codec can be a Joint Photographic Experts Group (JPEG) codec, a Moving Picture Experts Group 4 (MPEG4) codec, a Wavelet codec, and the like. The image processor 150 can include the On Screen Display (OSD) features, and can output OSD data depending on the size of a displayed screen, under control of a controller 110.

A memory 130 includes a program memory and a data memory. The program memory stores programs for controlling the general operation of the terminal, and programs for automatically adjusting volume of audio files based on a representative volume extracted from individual frame information of an audio file, and playing the audio files with the adjusted volume according to an embodiment of the present disclosure. The data memory temporarily stores the data generated during execution of the programs.

In accordance with an embodiment of the present disclosure, the memory 130 stores an audio file, playback of which is completed, and the last master volume of the audio file, with automatic volume adjustment being set in the terminal.

The display 160 displays, on a screen, the image signals output from the image processor 150 and the user data output from the controller 110. The display 160 includes a Liquid Crystal Display (LCD) display. In this case, the display 160 includes an LCD controller, a memory for storing image data, and an LCD panel. When implemented to have an LCD touch screen, the display 160 serves as an input unit, and in this case, the same keys as those of the key input unit 127 can be displayed on the display 160.

In accordance with an embodiment of the present disclosure, the display 160 displays automatic volume adjustment settings when automatic volume adjustment is set in a music playback mode, and can differently display a master volume determined before setting of automatic volume adjustment (i.e., the existing master volume corresponding to a representative volume of an audio file) and a master volume determined after setting of automatic volume adjustment (i.e., the current master volume that is adjusted by a deviation between the representative volume of the audio file and a reference volume).

The display 160 displays an icon for switching from the music playback mode to an automatic volume adjustment mode.

The controller 110 controls the overall operation of the terminal.

In accordance with an embodiment of the present disclosure, the controller 110 switches to the automatic volume adjustment mode when automatic volume adjustment is set in the music playback mode, controls an automatic volume adjuster 200 to adjust a master volume by a deviation between a representative volume of an audio file and a reference volume in the automatic volume adjustment mode, and controls an audio file player 170 to play the audio file with the adjusted master volume. The master volume that is adjusted by the deviation between the representative volume of the audio file and the reference volume can have the same value as that of the reference volume, since the master volume is set to the same value as that of the representative volume of the audio file.

The controller 110 stores the last master volume of the audio file in the memory 130 to correspond to the audio file, when playback of the audio file is completed.

The audio file player 170 plays the audio file with a master volume provided from the automatic volume adjuster 200 under control of the controller 110, in the automatic volume adjustment mode.

The automatic volume adjuster 200 extracts a representative volume from a gain of an audio file, adjusts a master volume by a deviation between the representative volume and a reference volume, and provides the adjusted master volume to the audio file player 170.

Figure 2:
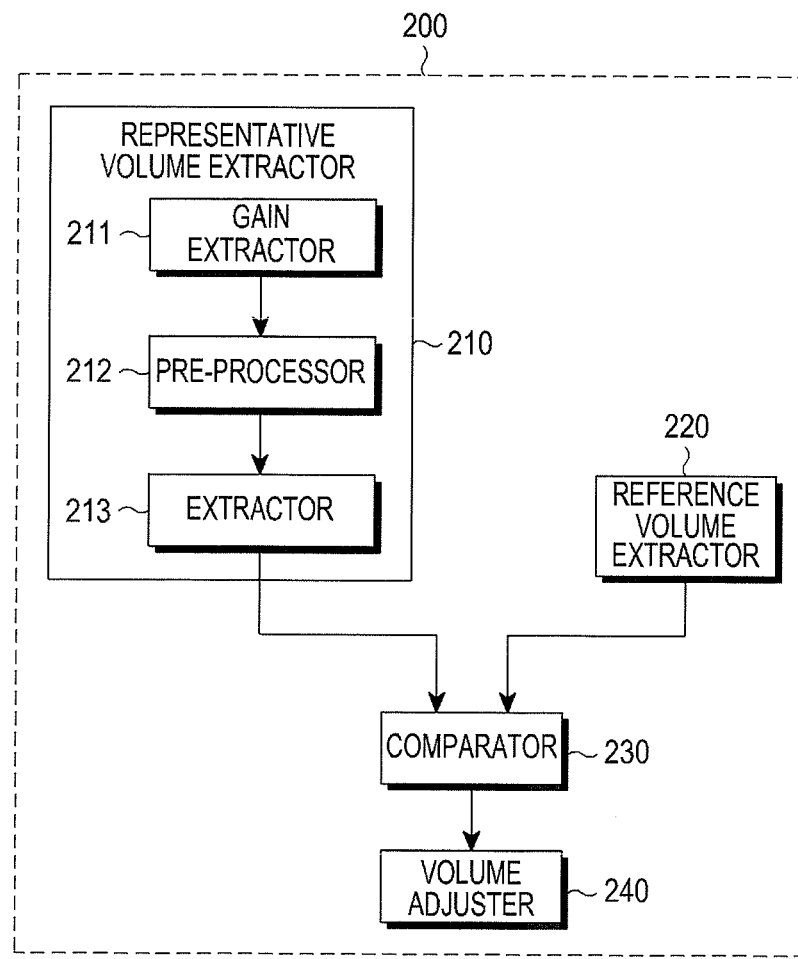
FIG. 2 illustrates a structure of an automatic volume adjuster according to an embodiment of the present disclosure.

A structure of the automatic volume adjuster 200 will be described with reference to FIG. 2. The automatic volume adjuster 200 includes a representative volume extractor 210, a reference volume extractor 220, a comparator 230, and a volume adjuster 240.

The representative volume extractor 210 includes a gain extractor 211, a pre-processor 212 and an extractor 213 to extract a gain from a header of each of a plurality of frames constituting the audio file and extract the representative volume from the extracted gains.

The gain extractor 211 extracts a gain from a header of each of a plurality of frames constituting the audio file. The gain may be referred to as a 'global gain', and it is possible to detect a global gain indicating an average volume of each frame by analyzing a header of each of a plurality frames constituting an audio file.

The pre-processor 212 performs a pre-processing operation of removing error components in all the gains extracted from the plurality of frames constituting the audio file, and filtering the error-removed gains using a moving average method or the like to reduce a change in the value that dramatically fluctuates between frames. The error components may include noise and interference. A known noise cancellation technique may be used to cancel the noise, and a known interference cancellation technique may be used to cancel the interference.

The extractor 213 extracts an average gain of the pre-processed all gains using a method of calculating an average value, and sets the average gain as the representative volume. For the method of calculating an average value, known technology such as a Root Mean Square (RMS) method may be used.

In an embodiment of the present disclosure, the extractor 213 is assumed to calculate an average gain using the RMS method.

A global gain, side information, exists as a value between 0 and 255 for each frame, and can be represented as an average volume of one frame. However, in a case where the recorded original audio data is encoded and generated as an audio file, a global gain value for each of a plurality frames included in the audio file may vary depending on the type of an encoder, or the global gain value may not be expressed as a value indicating an average volume. Strictly speaking, therefore, sometimes the global gain may not be considered as an exact average volume.

To cope with this shortcoming, the extractor 213 creates a curved envelope using the pre-processed all gains which have undergone error cancellation and filtering, and extracts, as a first average gain, the gains included in some section (for example, in the highlight section which is some left and right sections around the peak) of the envelope. The extractor 213 extracts Pulse Code Modulation (PCM) data by performing full decoding on the partial section and extracts a second average gain from the extracted PCM data using the RMS method.

The extractor 213 extracts an offset between the first and second average gains, applies the extracted offset to the pre-processed all gains, extracts an average gain of all of the gains to which the offset is applied, and sets the average gain as the representative volume.

If there is no offset between the first and second average gains, the extractor 213 extracts an average gain of the pre-processed all gains, and sets the average gain as the representative volume.

The reference volume extractor 220 sets a master volume of the last played audio file in a music playback list, as a reference volume. If there is no audio file in the music playback list, the reference volume extractor 220 sets a predetermined volume as the reference volume.

The comparator 230 compares the representative volume extracted by the representative volume extractor 210 with the reference volume that is set by the reference volume extractor 220, and provides the comparison results to the volume adjuster 240.

If it is determined from the comparison results provided from the comparator 230 that the representative volume is different from the reference volume, the volume adjuster 240 extracts a deviation between the representative volume and the reference volume, adjusts the master volume by the extracted deviation, and transfers the adjusted master volume to the audio file player 170.

If it is determined from the comparison results provided from the comparator 230 that the representative volume is equal to the reference volume, the volume adjuster 240 transfers a master volume corresponding to the representative volume of the audio file (i.e., having the same value as that of the representative volume of the audio file), to the audio file player 170.

When a volume-up or a volume-down occurs while the terminal plays the audio file with the master volume, the volume adjuster 240 adjusts the master volume to correspond to the volume-up or the volume-down and transfers the adjusted master volume to the audio file player 170.

An operation of automatically adjusting volume of an audio file in a terminal will be described in detail with reference to FIGS. 3 to 6B.

Figure 3:
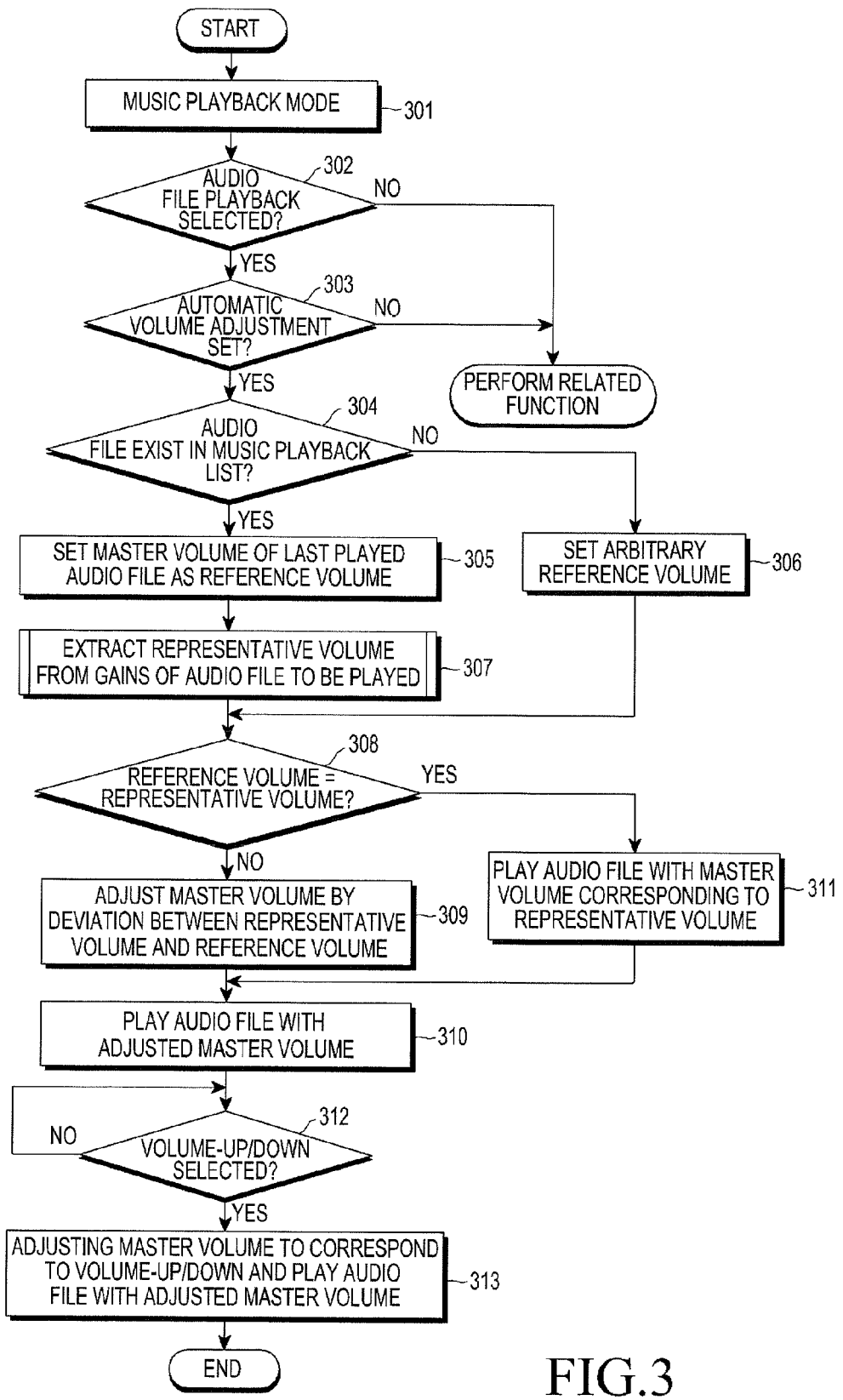
FIG. 3 illustrates a process of automatically adjusting volume of an audio file in a terminal according to an embodiment of the present disclosure.
Figure 4:
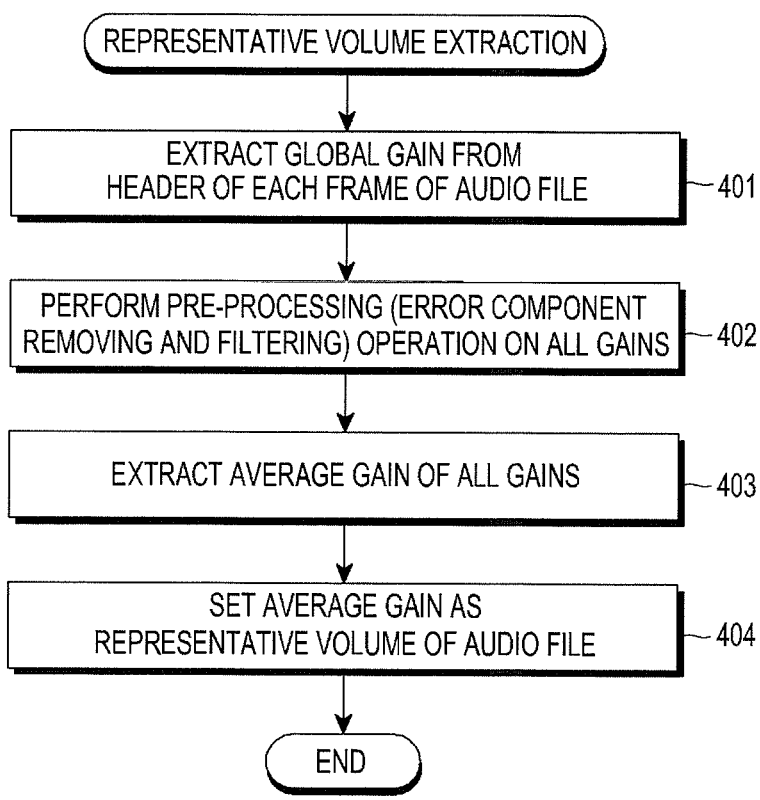
FIG. 4 illustrates a process of extracting a representative volume of an audio file in a terminal according to a first embodiment of the present disclosure.
Figure 5:
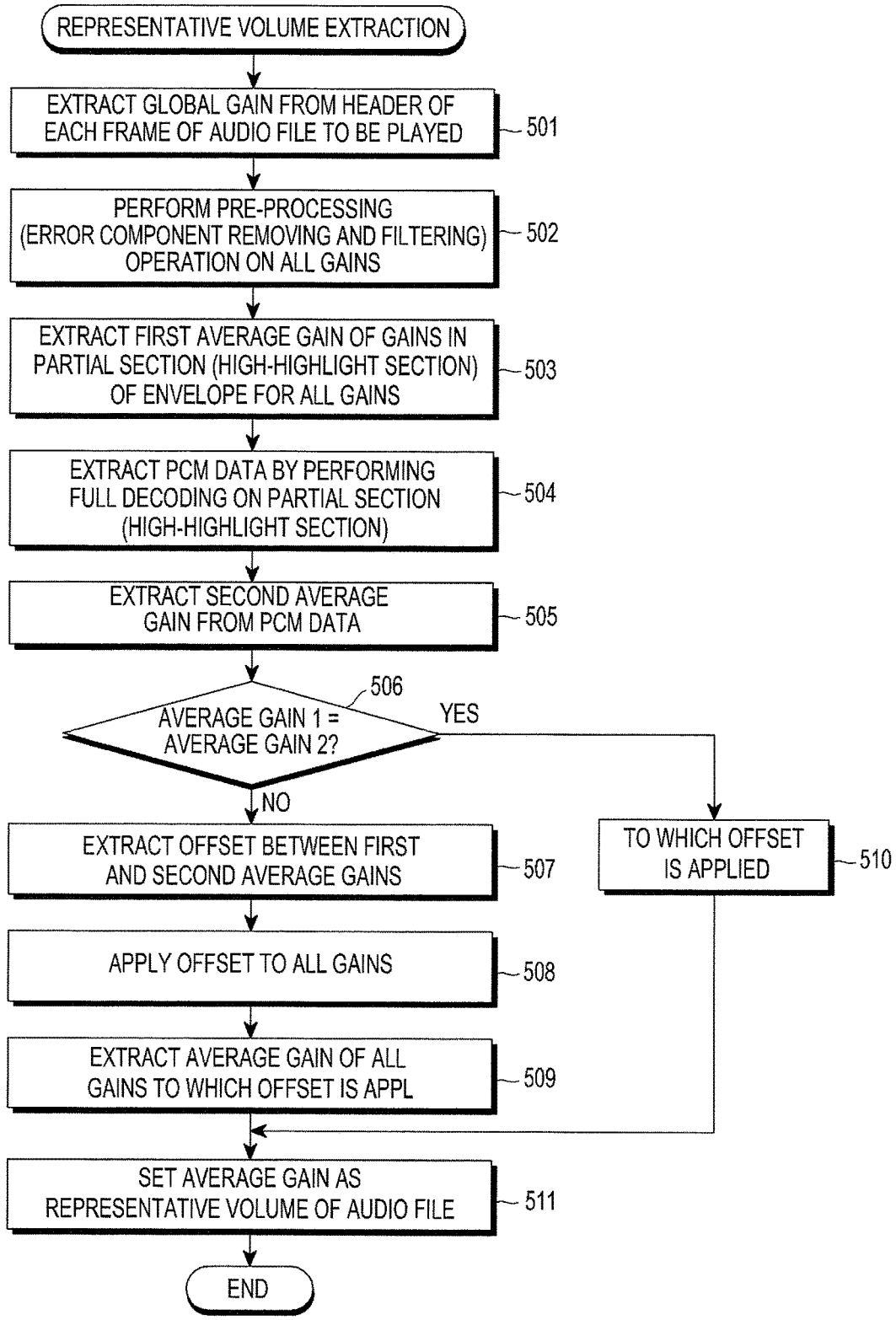
FIG. 5 illustrates a process of extracting a representative volume of an audio file in a terminal according to a second embodiment of the present disclosure.

FIG. 3 illustrates a process of automatically adjusting volume of an audio file in a terminal according to an embodiment of the present disclosure. FIG. 4 illustrates a process of extracting a representative volume of an audio file in a terminal according to a first embodiment of the present disclosure. FIG. 5 illustrates a process of extracting a representative volume of an audio file in a terminal according to a second embodiment of the present disclosure.

An embodiment of the present disclosure will be described in detail with reference to FIGS. 3 to 6B, together with FIGS. 1 and 2.

Referring to FIG. 3, the controller 110 determines in step 302 whether playback of an audio file has been selected by a user in a music playback mode of step 301. If playback of an audio file is selected in step 302, the controller 110 determines in step 303 whether automatic volume adjustment is set. If automatic volume adjustment is set, the controller 110 switches to an automatic volume adjustment mode.

The controller 110 also switches to the automatic volume adjustment mode, when switching to the automatic volume adjustment mode is selected, for example, when an icon for switching to the automatic volume adjustment mode displayed on the display 160 is selected, while playing the audio file in the music playback mode.

In the automatic volume adjustment mode, the controller 110 informs the automatic volume adjuster 200 of the switching to the automatic volume adjustment mode, and the reference volume extractor 220 in the automatic volume adjuster 200 determines in step 304 whether there is a previously played audio file in a music playback list.

If there is a previously played audio file in the music playback list in step 304, the reference volume extractor 220 extracts a master volume of the last played audio file from the music playback list, sets the extracted master volume as a reference volume, and provides the reference volume to the comparator 230, in step 305.

If there is no master volume in the last played audio file in the music playback list in step 305, the reference volume extractor 220 sets a predetermined volume value as a reference volume.

However, if there is no previously played audio file in the music playback list in step 304, the reference volume extractor 220 sets a predetermined volume value as a reference volume and provides the reference volume to the comparator 230, in step 306.

In step 307, the representative volume extractor 210 extracts a representative volume from gains of the audio file to be played.

A process of extracting a representative volume from gains of the audio file in step 307 will be described in detail with reference to FIGS. 4 and 5.

Referring to FIG. 4, in step 401, the gain extractor 211 in the representative volume extractor 210 extracts a global gain as side information from a header of each of a plurality of frames constituting the audio file, and provides the extracted global gains to the pre-processor 212.

In step 402, the pre-processor 212 performs a pre-processing operation of removing and filtering error components in all the extracted gains, and provides the pre-processing results to the extractor 213.

The extractor 213 extracts an average gain of the pre-processed all gains using the RMS method in step 403, and sets the extracted average gain as a representative volume of the audio file and provides the representative volume to the comparator 230 in step 404.

Referring to FIG. 5, in step 501, the gain extractor 211 in the representative volume extractor 210 extracts a global gain as side information from a header of each of a plurality of frames constituting the audio file, and provides the extracted global gains to the pre-processor 212.

In step 502, the pre-processor 212 performs a pre-processing operation of removing and filtering error components in all the extracted gains, and provides the pre-processing results to the extractor 213.

In step 503, the extractor 213 extracts a first average gain of gains in a partial section (e.g., a high-highlight section) of an envelope made of the pre-processed all gains, using the RMS method.

The extractor 213 extracts PCM data by performing full decoding on the partial section in step 504, and extracts a second average gain from the extracted PCM data using the RMS method in step 505.

In step 506, the extractor 213 compares the first average gain extracted in step 503 with the second average gain extracted in step 505 to determine whether the first average gain is different from the second average gain. If the first average gain is different from the second average gain in step 506, the extractor 213 extracts an offset between the first and second average gains in step 507.

The extractor 213 adjusts all the gains by applying the offset to all the gains pre-processed in step 502, in step 508, and extracts an average gain of all the adjusted gains to which the offset is applied, using the RMS method in step 509.

In step 511, the extractor 213 sets the average gain extracted in step 509 as a representative volume of the audio file, and provides the representative volume to the comparator 230.

However, if the first average gain is equal to the second average gain in step 506, the extractor 213 extracts an average gain of all the gains pre-processed in step 502, using the RMS method in step 510.

In step 511, the extractor 213 sets the average gain extracted in step 510 as a representative volume of the audio file and provides the representative volume to the comparator 230.

If the representative volume extractor 210 provides the representative volume of the audio file to the comparator 230 in step 307 and the reference volume extractor 220 provides the reference volume to the comparator 230 in step 305 or 306, the comparator 230 compares the representative volume of the audio file with the reference volume, and provides the comparison results to the volume adjuster 240.

The comparator 230 determines in step 308 whether the representative volume of the audio file is not equal to the reference volume and there is a deviation between them. If there is a deviation between the representative volume of the audio file and the reference volume, the volume adjuster 240 adjusts the master volume by the deviation between the representative volume of the audio file and the reference volume in step 309.

The term 'master volume' as used herein can refer to a value for substantially adjusting the volume of a media player in a music playback mode of a terminal, and presently, the master volume has the same value as the representative volume of the audio file. Therefore, the master volume, which is set to have the same value as that of the representative volume of the audio file, can have the same value as that of the reference value as it is adjusted by a deviation between the representative volume and the reference volume.

For example, when a representative volume of an audio file is '5' and a reference volume is '3', the current master volume of '5', which corresponds to the representative volume of the audio file, is reduced by a deviation of '2' between the representative volume and the reference volume, so the master volume adjusted to '3' is provided to the audio file player 170.

If the volume adjuster 240 provides the master volume adjusted in step 309 to the audio file player 170, the audio file player 170 plays the audio file with the mater volume provided from the volume adjuster 240 in step 310.

However, if it is compared and determined in step 308 that there is no deviation between the representative volume of the audio file and the reference volume because of their sameness, the volume adjuster 240 provides the master volume which corresponds (i.e., which is set to have the same value as that of the representative volume of the audio file) to the representative volume of the audio file, to the audio file player 170 in step 311.

For example, when a representative volume of an audio file is '3' and a reference volume is '3', the current master volume of '3', which corresponds to the representative volume of the audio file, is provided to the audio file player 170, since there is no deviation between the representative volume and the reference volume.

In step 310, the audio file player 170 plays the audio file with the master volume provided from the volume adjuster 240.

If a volume-up or a volume-down is selected by the user in step 312 while playing the audio file with the master volume provided in step 311, the controller 110 informs the automatic volume adjuster 200 of the user's selection.

In step 313, the volume adjuster 240 in the automatic volume adjuster 200 adjusts the master volume to correspond to the volume-up or volume-down, and the audio file player 170 plays the audio file with the adjusted master volume.

Even though the audio file player 170 plays the audio file with the automatically adjusted master volume, the user may adjust the master volume to his/her own desired volume. Thus, in step 313, when the terminal is manually volumed up/down again by the user, the volume adjuster 240 adjusts the master volume to correspond to the volume-up or volume-down.

If the playback of the audio file is completed, the controller 110 stores the last master volume of the played audio file in the memory 130 as the master volume of the audio file.

During playback of the next audio file, the master volume of the previous audio file, which exists in the music playback list as the last played audio file, is set as a reference volume of the next audio file.

Figure 6A:
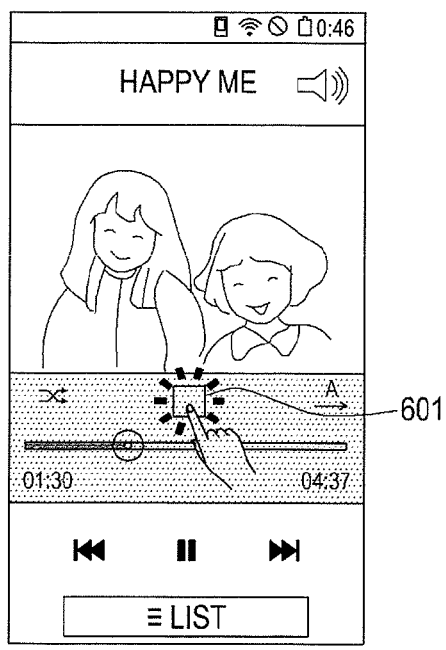
FIGS. 6A and 6B illustrate screens on which automatic volume adjustment is set in a terminal according to an embodiment of the present disclosure.
Figure 6B:
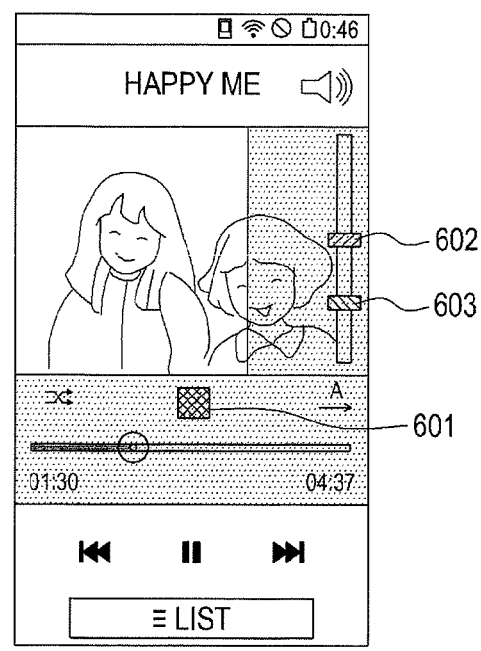

FIGS. 6A and 6B show screens on which automatic volume adjustment is set in a terminal according to an embodiment of the present disclosure.

In FIG. 6A, an icon 601 is displayed, which makes it possible to switch to an automatic volume adjustment mode during playback of an audio file in a music playback mode.

In FIG. 6B, the terminal switches to the automatic volume adjustment mode and displays playback of the audio file, when the icon 601 for switching to the automatic volume adjustment mode is selected in FIG. 6A. The icon 601 in FIG. 6B is displayed in a different color or shape from that of the icon 601 in FIG. 6A.

As shown in FIG. 6B, in the automatic volume adjustment mode, a master volume 602 determined before switching to the automatic volume adjustment mode and a master volume 603 determined after switching to the automatic volume adjustment mode is displayed in visually different ways.

The master volume 602 is a master volume, with which the terminal played the audio file before switching to the automatic volume adjustment mode, and which corresponds to the representative volume of the audio file.

The master volume 603 is a master volume, which is adjusted by a deviation between a representative volume of the audio file and a reference volume after the terminal switches to the automatic volume adjustment mode, and with which the terminal presently plays the audio file.

A volume adjustment apparatus and method proposed by the present disclosure is implemented with computer-readable codes recorded in a computer-readable recording medium. The computer-readable recording medium includes all kinds of recording devices in which computer-readable data is stored. Examples of the recording medium includes Read Only Memory (ROM), Random Access Memory (RAM), optical disks, magnetic tapes, floppy disks, hard disks, and nonvolatile memories, and the computer-readable data stored therein can be transmitted on carrier waves or over the Internet. The computer-readable recording media can be distributed to computer systems connected over the network, and computer-readable codes can be stored and run therein in a distributed manner.

As is apparent from the foregoing description, the volume adjustment apparatus and method provided by the present disclosure can prevent sound fluctuations occurring due to a deviation in volume between different audio files, and quickly remove the volume deviation between the audio files, making it possible to play audio files with a constant volume.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A terminal comprising:
a representative volume extractor configured to:
extract a gain from a header of each of a plurality of frames of an audio file and set an average gain of all extracted gains as a representative volume;
a reference volume extractor configured to:
set a master volume of a last played audio file as the representative volume if there is an audio file in a music playback list, and
set a predetermined volume value as the reference volume if there is no audio file in the music playback list;
a comparator configured to compare the representative volume provided from the representative volume extractor with the reference volume provided from the reference volume extractor;
a volume adjuster configured to:
adjust the master volume by a deviation between the representative volume and the reference volume if the representative volume is different from the reference volume,
adjust the master volume to correspond to a volume-up or a volume-down if the volume-up or the volume-down occurs during playback of the audio file with the adjusted master volume, and
transfer the adjusted master volume to an audio file player;
the audio file player is configured to play the audio file with the master volume provided from the volume adjuster; and
a controller configured to
determine whether automatic volume adjustment is set if playback of the audio file is selected in a music playback mode,
switch to an automatic volume adjustment mode if the automatic volume adjustment is set, and
control the audio file player to play the audio file with the master volume provided from the volume adjuster in the automatic volume adjustment mode.

2. The terminal of claim 1, wherein the gain extracted from the header of each of the plurality of frames is a global gain indicating an average volume of each frame.

3. The terminal of claim 1, wherein the representative volume extractor comprises:
a gain extractor configured to extract the gain from the header of each of the plurality of frames constituting the audio file;
a pre-processor configured to perform a pre-processing operation of removing or filtering error components in all of the extracted gains from the audio file; and
an extractor configured to
extract the average gain of all the pre-processed extracted gains, and
set the extracted average gain as the representative volume.

4. The terminal of claim 3, wherein the extractor is further configured to:
extract a first average gain of gains in a partial section of an envelope of the pre-processed all of the extracted gains, extract a second average gain from Pulse Code Modulation (PCM) data extracted by performing full decoding on the partial section,
apply an offset between the first and second average gains to all the pre-processed extracted gains,
extract an average gain of all of the extracted gains to which the offset is applied,
extract an average gain of all the pre-processed extracted gains if there is no offset between the first and second average gains, and
set the average gain as the representative volume.

5. The terminal of claim 1, wherein the controller is further configured to store a last master volume of the audio file upon completion of the playback of the audio file, in order to use the last master volume of the audio file as a reference volume for a next audio file.

6. A terminal comprising:
a representative volume extractor configured to extract, as a representative volume, an average gain of all gains that are extracted from a header of each of a plurality of frames of an audio file;
a reference volume extractor configured to
set a master volume of a last played audio file in a music playback list as a reference volume,
extract a predetermined volume, and
set the extracted volume as the reference volume if there is no audio file in the music playback list;
a comparator configured to compare the representative volume set by the representative volume extractor with the reference volume set by the reference volume extractor;
a volume adjuster configured to:
extract a deviation between the representative volume and the reference volume if the representative volume is different from the reference volume,
adjust the master volume by the extracted deviation, and
transfer the adjusted master volume to an audio file player; and
the audio file player configured to play the audio file with the adjusted master volume provided from the volume adjuster;
wherein the representative volume extractor comprises:
a gain extractor configured to extract a gain from a header of each of a plurality of frames constituting an audio file;
a pre-processor configured to perform a pre-processing operation of removing or filtering error components in all the gains extracted from the audio file; and
an extractor configured to
extract an average gain of all the pre-processed gains, and
set the extracted average gain as the representative volume.

7. The terminal of claim 6, wherein the gain extracted from the header of each of the plurality of frames is a global gain indicating an average volume of each frame.

8. The terminal of claim 6, wherein the extractor is configured to:
extract a first average gain of gains in a partial section of an envelope of all the pre-processed gains,
extract a second average gain from Pulse Code Modulation (PCM) data extracted by performing full decoding on the partial section,
apply an offset between the first and second average gains to all the pre-processed gains,
extract an average gain of all of the pre-processed gains to which the offset is applied,
extract an average gain of all the pre-processed gains if there is no offset between the first and second average gains, and
set the average gain as the representative volume.

9. The terminal of claim 6, wherein if a volume-up or a volume-down occurs during playback of the audio file with the adjusted master volume, the volume adjuster is configured to adjust the master volume to correspond to the volume-up or the volume-down and transfer the adjusted master volume to the audio file player.

10. The terminal of claim 6, further comprising a controller configured to:
switch to an automatic volume adjustment mode if automatic volume adjustment is set in a music playback mode,
play the audio file with the adjusted master volume provided from the volume adjuster in the automatic volume adjustment mode; and
store a last master volume of the audio file upon completion of playback of the audio file, in order to use the last master volume of the audio file as a reference volume for a next audio file.

11. A method for adjusting volume in a terminal, the method comprising:
determining whether automatic volume adjustment is set, if playback of an audio file is selected in a music playback mode;
switching to an automatic volume adjustment mode if the automatic volume adjustment is set;
setting a master volume of a last played audio file as a reference volume in the automatic volume adjustment mode if there is an audio file in a music playback list,
setting a predetermined value as the reference volume if there is no audio file in the music playback list;
extracting a gain from a header of each of a plurality of frames constituting an audio file, extracting an average gain of all gains extracted from the audio file,
setting the extracted average gain as a representative volume;
comparing the representative volume with the reference volume,
adjusting the master volume by a deviation between the representative volume and the reference volume if the representative volume is different from the reference volume;
playing the audio file with the adjusted master volume; and
adjusting the master volume to correspond to a volume-up or a volume-down if the volume-up or the volume-down occurs during playback of the audio file with the adjusted master volume, and playing the audio file with the adjusted master volume.

12. The method of claim 11, wherein the gain extracted from the header of each of the plurality of frames is a global gain indicating an average volume of each frame.

13. The method of claim 11, wherein setting a representative volume comprises:
extracting a first average gain of gains in a partial section of an envelope of all pre-processed gains;
extracting a second average gain from Pulse Code Modulation (PCM) data extracted by performing full decoding on the partial section;

applying an offset between the first and second average gains to the pre-processed all gains, and extracting an average gain of all of the gains to which the offset is applied;

extracting an average gain of all the pre-processed gains if there is no offset between the first and second average gains; and setting the average gain as the representative volume.

14. The method of claim 11, further comprising storing a last master volume of the audio file upon completion of the playback of the audio file, in order to use the last master volume of the audio file as a reference volume for a next audio file.

15. A method for adjusting volume in a terminal, the method comprising:

setting a master volume of a last played audio file as a representative volume if there is an audio file in a music playback list;

setting a predetermined volume value as a reference volume if there is no audio file in the music playback list;

extracting a gain from a header of each of a plurality of frames constituting an audio file, performing a pre-processing operation of removing or filtering error components in all gains extracted from the audio file, extracting an average gain of all the pre-processed gains, setting the extracted average gain as the representative volume;

comparing the representative volume with the reference volume, adjusting the master volume by a deviation between the representative volume and the reference volume if the representative volume is different from the reference volume; and playing the audio file with the adjusted master volume.

16. The method of claim 15, wherein the gain extracted from the header of each of the plurality of frames is a global gain indicating an average volume of each frame.

17. The method of claim 15, wherein setting the representative volume comprises:

extracting a first average gain of gains in a partial section of an envelope of all the pre-processed gains;

extracting a second average gain from Pulse Code Modulation (PCM) data extracted by performing full decoding on the partial section;

applying an offset between the first and second average gains to all the pre-processed gains, extracting an average gain of all of the gains to which the offset is applied;

extracting an average gain of all the pre-processed gains if there is no offset between the first and second average gains, and setting the extracted average gain as the representative volume.

18. The method of claim 15, further comprising:

adjusting the master volume to correspond to a volume-up or a volume-down if the volume-up or the volume-down occurs during playback of the audio file with the adjusted master volume, and playing the audio file with the adjusted master volume.

19. The method of claim 15, further comprising storing a last master volume of the audio file upon completion of playback of the audio file, in order to use the last master volume of the audio file as a reference volume for a next audio file.

* * * * *